(12) United States Patent
Yun et al.

(10) Patent No.: US 11,621,406 B2
(45) Date of Patent: Apr. 4, 2023

(54) DISPLAY APPARATUS AND METHOD OF MANUFACTURING THE SAME

(71) Applicant: Samsung Display Co., Ltd., Yongin-si (KR)

(72) Inventors: Wonmin Yun, Yongin-si (KR); Yisu Kim, Yongin-si (KR); Eungseok Park, Yongin-si (KR); Byoungduk Lee, Yongin-si (KR); Yoonhyeung Cho, Yongin-si (KR); Yongchan Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/885,762

(22) Filed: May 28, 2020

(65) Prior Publication Data

US 2020/0295302 A1    Sep. 17, 2020

Related U.S. Application Data

(63) Continuation of application No. 16/440,917, filed on Jun. 13, 2019, now Pat. No. 10,707,445, which is a
(Continued)

(30) Foreign Application Priority Data

Jun. 1, 2016  (KR) .................. 10-2016-0068149
Mar. 17, 2017  (KR) .................. 10-2017-0033870

(51) Int. Cl.
*H01L 51/52*    (2006.01)
*H01L 27/32*    (2006.01)

(52) U.S. Cl.
CPC ...... *H01L 51/5256* (2013.01); *H01L 51/5284* (2013.01); *H01L 27/3244* (2013.01)

(58) Field of Classification Search
CPC ............. H01L 51/5237; H01L 51/5256; H01L 51/5253; H01L 51/5284; H01L 51/5262; H01L 2227/32
See application file for complete search history.

(56) References Cited

U.S. PATENT DOCUMENTS 3,716,586 A * 2/1973 Hofer .................... C07C 323/00
                                                              568/333
7,183,197 B2 * 2/2007 Won ......................... C23C 8/36
                                                              257/278
(Continued)

FOREIGN PATENT DOCUMENTS

CN      101501832 A     8/2009
CN      101766055 A     6/2010
(Continued)

OTHER PUBLICATIONS

Translation of WO2020/159130A1 (Kim et al) (Aug. 5, 2020). (Year: 2020).*
(Continued)

*Primary Examiner* — Caridad Everhart
(74) *Attorney, Agent, or Firm* — Lewis Roca Rothgerber Christie LLP

(57) ABSTRACT

A display apparatus includes a substrate, a display arranged on the substrate and including a plurality of display elements, and an encapsulator arranged on the display and encapsulating the display. The encapsulator may include at least one inorganic film and at least one organic film, and the at least one organic film may include a matrix and an ultraviolet light absorbent dispersed in the matrix.

5 Claims, 7 Drawing Sheets

Related U.S. Application Data continuation of application No. 15/611,129, filed on Jun. 1, 2017, now Pat. No. 10,355,243.

(56) References Cited

U.S. PATENT DOCUMENTS

| | | | |
|---|---|---|---|
| 7,399,712 B1* | 7/2008 | Graff | H01L 21/31144 257/E21.257 |
| 8,044,573 B2 | 10/2011 | Kim et al. | |
| 8,697,503 B2 | 4/2014 | Haskal et al. | |
| 9,671,646 B1 | 6/2017 | Tang | |
| 10,355,243 B2* | 7/2019 | Yun | H01L 51/5284 |
| 10,707,445 B2* | 7/2020 | Yun | H01L 51/5253 |
| 2001/0026347 A1 | 10/2001 | Sawasaki et al. | |
| 2003/0210371 A1 | 11/2003 | Chaudhari et al. | |
| 2004/0075094 A1* | 4/2004 | Yamazaki | H01L 21/76804 257/72 |
| 2006/0078677 A1* | 4/2006 | Won | C23C 28/00 427/248.1 |
| 2007/0200492 A1 | 8/2007 | Cok et al. | |
| 2007/0221939 A1 | 9/2007 | Taskar et al. | |
| 2008/0218064 A1 | 9/2008 | Cho et al. | |
| 2009/0026934 A1* | 1/2009 | Fujita | C09J 123/20 313/504 |
| 2009/0105395 A1 | 4/2009 | Kamata et al. | |
| 2009/0139564 A1 | 6/2009 | Miyaji et al. | |
| 2010/0244073 A1 | 9/2010 | Ito et al. | |
| 2011/0132449 A1 | 6/2011 | Ramadas et al. | |
| 2012/0196446 A1* | 8/2012 | Graff | H01L 21/31122 438/725 |
| 2012/0258295 A1 | 10/2012 | Leyder et al. | |
| 2013/0235515 A1* | 9/2013 | Ouderkirk | G02F 1/1333 361/679.01 |
| 2013/0327376 A1 | 12/2013 | Bulliard et al. | |
| 2014/0374729 A1* | 12/2014 | Dobbertin | H01L 51/0014 257/40 |
| 2015/0056757 A1* | 2/2015 | Liu | H01B 3/447 525/191 |
| 2015/0076461 A1 | 3/2015 | Shitagaki et al. | |
| 2015/0104624 A1 | 4/2015 | Jang et al. | |
| 2015/0228916 A1 | 8/2015 | Bulovic et al. | |
| 2015/0303336 A1 | 10/2015 | Lefebvre et al. | |
| 2015/0320036 A1 | 11/2015 | Forim et al. | |
| 2015/0321453 A1 | 11/2015 | Lellig et al. | |
| 2016/0035894 A1 | 2/2016 | Wang et al. | |
| 2016/0064690 A1* | 3/2016 | Kook | H01L 51/5256 257/40 |
| 2016/0139506 A1 | 5/2016 | Robinson et al. | |
| 2016/0322604 A1* | 11/2016 | Ho | H01L 27/3262 |
| 2017/0155085 A1 | 6/2017 | Kwon et al. | |
| 2018/0009775 A1* | 1/2018 | Tanaka | G03F 7/039 |
| 2018/0155621 A1 | 6/2018 | Zych et al. | |
| 2018/0157125 A1* | 6/2018 | Yasui | B32B 27/30 |

FOREIGN PATENT DOCUMENTS

| | | |
|---|---|---|
| CN | 105446000 A | 3/2016 |
| JP | 2012-234809 A | 11/2012 |
| KR | 10-2009-0008627 A | 1/2009 |
| KR | 10-2010-0053533 A | 5/2010 |
| KR | 10-2011-0046564 A | 5/2011 |
| KR | 10-2015-0136798 A | 12/2015 |
| WO | WO2020159130 A1 * | 8/2020 ............ H01L 33/56 |

OTHER PUBLICATIONS

Partial English Translation of the relevant portion of JP 2012-234809 A (2 pages).

* cited by examiner

DISPLAY APPARATUS AND METHOD OF MANUFACTURING THE SAME

CROSS-REFERENCE TO RELATED APPLICATION

This application is a continuation of U.S. patent application Ser. No. 16/440,917, filed on Jun. 13, 2019, which is a continuation of U.S. patent application Ser. No. 15/611,129, filed on Jun. 1, 2017, now U.S. Pat. No. 10,355,243, issued on Jul. 16, 2019, which claims priority to and the benefit of Korean Patent Application No. 10-2016-0068149, filed on Jun. 1, 2016, and Korean Patent Application No. 10-2017-0033870, filed on Mar. 17, 2017, in the Korean Intellectual Property Office, the entire contents of all of which are incorporated herein by reference.

BACKGROUND

1. Field

Embodiments relate to a display apparatus and a method of manufacturing the same.

2. Description of the Related Art

Along with developments in information technology, the market for display devices, which connect users with information, is expanding. Various types of display devices have been developed.

SUMMARY

Embodiments are directed to a display apparatus, including a substrate, a display arranged on the substrate and including a plurality of display elements, and an encapsulator arranged on the display and encapsulating the display. The encapsulator may include at least one inorganic film and at least one organic film, and the at least one organic film may include a matrix and an ultraviolet light absorbent dispersed in the matrix.

The ultraviolet light absorbent may be a compound that includes a hydroxyl group.

The ultraviolet light absorbent may include one or more of a benzophenone compound, a benzotriazole compound, a benzoate compound, a cyanoacrylate compound, a triazine compound, an oxanilide compound, and a salicylate compound.

The ultraviolet light absorbent may be cross-linked with the matrix.

The ultraviolet light absorbent may be a compound that includes at least one of an acrylate group, a methacrylate group, and an epoxy group.

The at least one organic film may include a first organic film and a second organic film, and the first organic film may include a first ultraviolet light absorbent and the second organic film may include a second ultraviolet light absorbent, a wavelength range of light absorbed by the first ultraviolet light absorbent being different from a wavelength range of light absorbed by the second ultraviolet light absorbent.

The at least one organic film may exhibit a transmittance of 80% or higher with respect to light having a wavelength of 430 nm or longer.

The at least one organic film may exhibit a transmittance of less than or equal to 10% with respect to light having a wavelength of 405 nm or shorter.

The encapsulator may have a structure in which the at least one inorganic film and the at least one organic film are alternately stacked.

The display elements may emit light at least in a direction toward the encapsulator.

Embodiments are also directed to a method of manufacturing a display apparatus, the method including forming a display including a plurality of display elements on a substrate, and forming an encapsulator encapsulating the display on the display. The forming of the encapsulator may include forming at least one inorganic film and forming at least one organic film, and the at least one organic film may be formed to include a matrix and an ultraviolet light absorbent dispersed in the matrix.

The ultraviolet light absorbent may include one or more of a benzophenone compound, a benzotriazole compound, a benzoate compound, a cyanoacrylate compound, a triazine compound, an oxanilide compound, and a salicylate compound.

In the forming of the at least one organic film, an organic film forming layer including a mixture of a first monomer constituting the matrix and a second monomer including the ultraviolet light absorbent may be formed on the substrate.

The organic film forming layer may include the first monomer and the second monomer cross-linked with each other.

The second monomer may include one or more of an acrylate group, a methacrylate group, or an epoxy group.

The forming of the at least one organic film may include forming a first organic film including a first ultraviolet light absorbent and forming a second organic film including a second ultraviolet light absorbent, a wavelength range of light absorbed by the first ultraviolet light absorbent being different from a wavelength range of light absorbed by the second ultraviolet light absorbent.

BRIEF DESCRIPTION OF THE DRAWINGS

Features will become apparent to those of skill in the art by describing in detail example embodiments with reference to the attached drawings in which.

DETAILED DESCRIPTION

Figure 1:
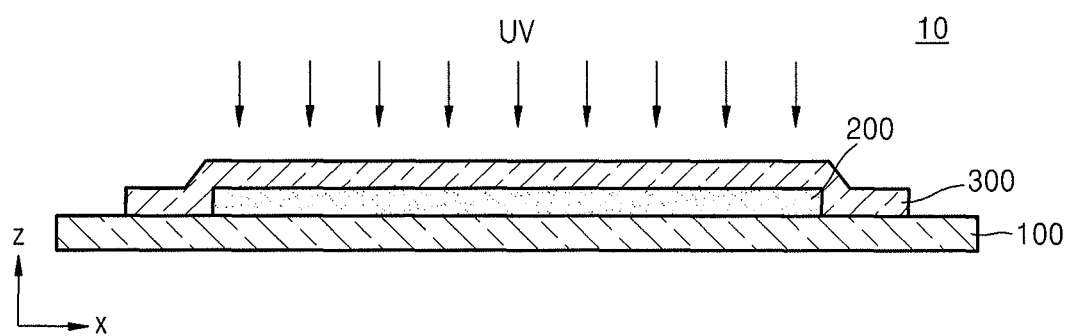
FIG. 1 illustrates a cross-sectional diagram schematically showing a state in which ultraviolet rays are irradiated to a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third, etc., may be used herein to describe various elements, components, regions, layers and/or sections, these elements, components, regions, layers and/or sections should not be limited by these terms.

It will be understood that when an element or layer is referred to as being "on" another element or layer, the element or layer may be directly on the other element or layer or intervening elements or layers may be present thereon.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
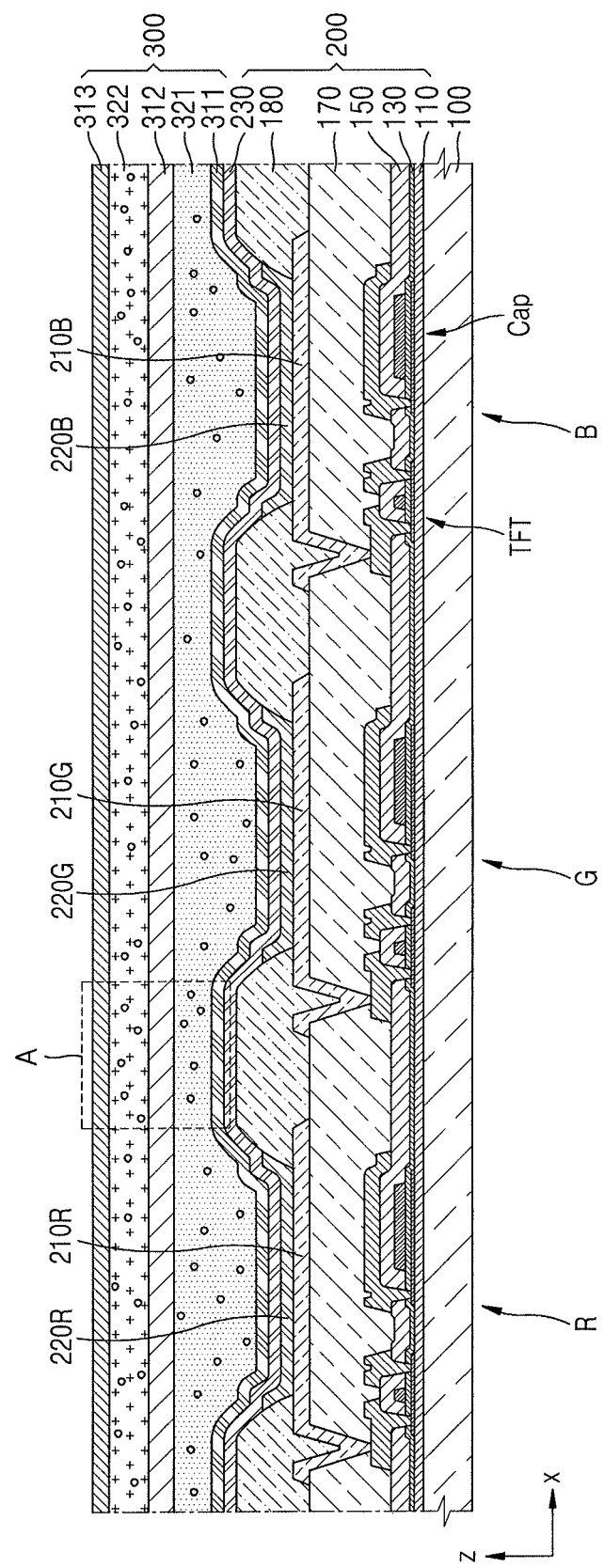
FIG. 2 illustrates a schematic cross-sectional view of a part of the display apparatus of FIG. 1.

FIG. 1 is a cross-sectional diagram schematically showing a state in which ultraviolet rays are irradiated to a display apparatus according to an embodiment, and FIG. 2 is a schematic cross-sectional view of a part of the display apparatus of FIG. 1. In particular, FIG. 2 is a cross-sectional diagram schematically showing an organic light emitting display apparatus having an organic light emitting element as a display element. However, embodiments are not limited to a method of manufacturing an organic light emitting display apparatus and may also be applied to a method of manufacturing a display apparatus including a display element of a different type.

Referring to FIGS. 1 and 2, a display apparatus 10 according to an embodiment includes a substrate 100, a display 200, and an encapsulator 300.

First, referring to FIG. 1, the display apparatus 10 is exposed to ultraviolet rays (UV) irradiated onto the encapsulator 300. The ultraviolet rays may be ultraviolet rays irradiated when a user uses the display apparatus 10 outdoors or may be ultraviolet rays irradiated during a process of manufacturing the display apparatus 10. For example, ultraviolet rays may be irradiated during the process of manufacturing the display apparatus 10 to cure an organic film of the encapsulator 300 or ultraviolet rays for cutting a substrate, e.g., a raw substrate.

Hereinafter, the structure of the display apparatus 10 will be described in more detail with reference to FIG. 2.

Referring to FIG. 2, a backplane may be provided first. The backplane may include at least the substrate 100, a plurality of first electrodes 210R, 210G, and 210B arranged on the substrate 100, and a pixel defining film 180 that is arranged to expose at least portions of the first electrodes 210R, 210G, and 210B respectively including center portions of the first electrodes 210R, 210G, and 210B. The pixel defining film 180 may have a shape protruding (in the +z direction) farther from the substrate 100 than the plurality of first electrodes 210R, 210G, and 210B.

The substrate 100 may include or be formed of various materials such as a glass material, a metal, or a plastic material, such as polyethylene terephthalate (PET), polyethylene naphthalate (PEN), or polyimide.

The plurality of first electrodes 210R, 210G, and 210B may be pixel electrodes 210R, 210G, and 210B, respectively. From among the pixel electrodes 210R, 210G, and 210B, the pixel electrode 210B may be a first pixel electrode, the pixel electrode 210R may be a second pixel electrode, and the pixel electrode 210G may be a third pixel electrode. Intermediate layers arranged on the first pixel electrode, the second pixel electrode, and the third pixel electrode may be different from one another.

The pixel electrodes 210R, 210G, and 210B may be, for example, transparent or semitransparent electrodes or reflective electrodes. The pixel electrodes 210R, 210G, and 210B may include, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrodes 210R, 210G, and 210B are reflective layers, the pixel electrodes 210R, 210G, and 210B may include reflective films including, for example, Ag, Mg, Al, Pt, Pd, Au, Ni, Nd, Ir, Cr, or a compound thereof, and/or films including ITO, IZO, ZnO, or $In_2O_3$. However, the structure and materials of the pixel electrodes 210R, 210G, and 210B are not limited thereto, and various modifications may be made.

The pixel electrodes 210R, 210G, and 210B may be located within a display region of the substrate 100.

The pixel defining film 180 may include openings corresponding to respective sub-pixels, for example, openings respectively exposing the center portions of the pixel electrodes 210R, 210G, and 210B or exposing the entire pixel electrodes 210R, 210G, and 210B, thereby defining pixels. The pixel defining film 180 may increase distances between end portions of the pixel electrodes 210R, 210G and 210B and a counter electrode (230) above the pixel electrodes 210R, 210G, which may help prevent arcs at the end portions of the pixel electrodes 210R, 210G, and 210B.

The backplane may include various components. For example, a thin film transistor TFT or a capacitor Cap may be arranged on the substrate 100 as shown in FIG. 2. A buffer layer 110 may be provided to help prevent impurities from infiltrating into a semiconductor layer of a thin film transistor TFT. The components may also include, for example, a gate insulating film 130 for insulating the semiconductor layer of the TFT from a gate electrode of the thin film transistor TFT, an interlayer insulating film 150 for insulating a source electrode/drain electrode of the TFT from the gate electrode of the TFT, a planarizing film 170 that covers the TFT and has a substantially flat top surface, etc.

Intermediate layers 220R, 220G, and 220B may be provided. Each of the intermediate layers 220R, 220G, and 220B may have a multilayer structure including a light emitting layer. In an implementation, some of the intermediate layers 220R, 220G, and 220B may be common layers substantially corresponding to the entire surface of the substrate 100, whereas the remaining ones of the intermediate layers 220R, 220G, and 220B may be pattern layers patterned in correspondence to the pixel electrodes 210R, 210G, and 210B. The intermediate layers 220R, 220G, and 220B may include, for example, a monomer material or a polymer material and may include, for example, a hole injection layer, a hole transport layer, an emission layer, an electron transport layer, and/or an electron injection layer. Various methods, such as a vapor deposition method, a spin coating method, an inkjet printing method, and/or a laser thermal transfer method, may be used to form the intermediate layers 220R, 220G, and 220B.

A counter electrode 230 may be on the intermediate layers 220R, 220G, and 220B. The counter electrode 230 may be, for example, a (semi-)transparent electrode or a reflective electrode. When the counter electrode 230 is a (semi-)transparent electrode, the counter electrode 230 may include a layer including, for example, Li, Ca, LiF/Ca, LiF/Al, Al, Ag, Mg, or a compound thereof and/or a (semi-)transparent conductive layer including ITO, IZO, ZnO, or $In_2O_3$. When the counter electrode 230 is a reflective electrode, the counter electrode 230 may include a layer including, for example, Li, Ca, LiF/Ca, LiF/Al, Al, Ag, Mg, or a compound thereof. However, the configuration and the materials of the counter electrode 230 are not limited thereto, and various modifications may be made.

An encapsulator 300 may be provided for protecting display elements (including, for example, the pixel electrodes 210R, 210G and 210B, the intermediate layers 220R, 220G and 220B, and the counter electrode 230) from impurities such as outside oxygen or outside moisture.

The encapsulator 300 may be arranged so as to extend to cover the top surface of the display part 200 and the side surfaces of the display 200, where the encapsulator 300 may contact a portion of the substrate 100. As a result, infiltration of outside oxygen and outside moisture into the display 200 may be reduced or prevented.

The encapsulator 300 may include, for example, at least one inorganic film 311, 312, and/or 313, and at least one organic film 321 and/or 322. The encapsulator 300 may have a structure in which the at least one inorganic film 311, 312, and/or 313 and the at least one organic film 321 and/or 322 are alternately and repeatedly stacked.

For example, the encapsulator 300 may include a first inorganic film 311, a second inorganic film 312, and a third inorganic film 313 in the order of being stacked in the +z direction. A first organic film 321 may be interposed between the first inorganic film 311 and the second inorganic film 312, and a second organic film 322 may be interposed between the second inorganic film 312 and the third inorganic film 313. However, the structure of the encapsulator 300 is not limited thereto, and the order of stacking of the inorganic films and the organic films as well as the number of the inorganic films and organic films may be modified according to designs. Thus, the encapsulator 300 may include at least one sandwich structure in which at least one organic film is interposed between at least two inorganic films. In another example, the encapsulator 300 may include at least one sandwich structure in which at least one inorganic film is interposed between at least two organic films. In another example, the encapsulator 300 may include a sandwich structure in which at least one organic film is interposed between at least two inorganic films and a sandwich structure in which at least one inorganic film is interposed between at least two organic films. For convenience of explanation, descriptions will be given in relation to a structure of the encapsulator 300 in which the first inorganic film 311 is arranged on a lowermost layer of the encapsulator 300, the first organic film 321 is interposed between the first inorganic film 311 and the second inorganic film 312, and the second organic film 322 is interposed between the second inorganic film 312 and the third inorganic film 313.

Figure 3:
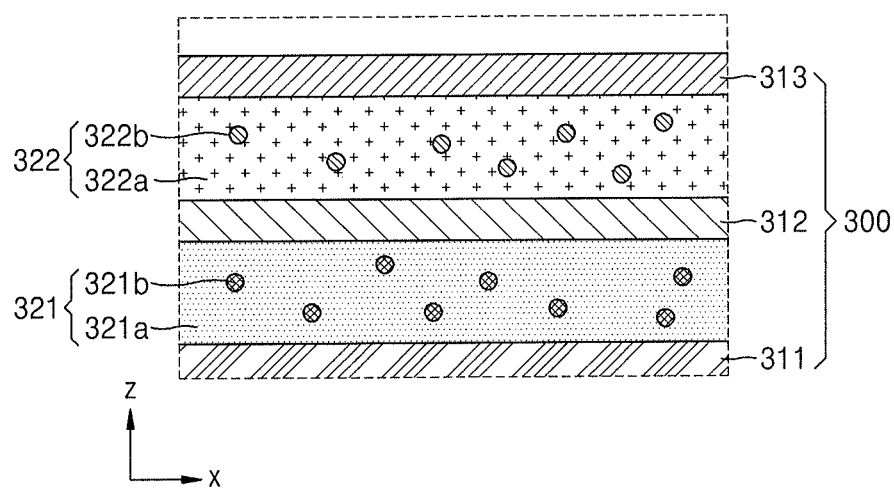
FIG. 3 illustrates a magnified cross-sectional view of portion A of FIG. 2.

FIG. 3 is a magnified cross-sectional view of the portion A of FIG. 2.

Referring to FIG. 3, the first inorganic film 311 is arranged on the lowermost layer of the encapsulator 300. The first inorganic film 311 may include a single film or stacked films containing, for example, a metal oxide or a metal nitride. For example, the first inorganic film 311 may include one or more of silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium nitride, cerium oxide, cerium nitride, tin oxide, tin nitride, and magnesium oxide. The inorganic film may have a small thickness and a high density, and may provide a barrier blocking infiltration of moisture and oxygen.

The first inorganic film 311 may be formed using a method such as chemical vapor deposition (CVD), plasma chemical vapor deposition (PECVD), sputtering, atomic layer deposition (ALD), thermal evaporation, etc. The first inorganic film 311 may be formed to have an appropriate thickness in consideration of productivity, device characteristics, etc.

The materials, the functions, and the manufacturing methods of the first inorganic film 311 as described above may also be applied to the second inorganic film 312 and the third inorganic film 313.

The first organic film 321 may be arranged on the first inorganic film 311. The first organic film 321 may include an organic material. The first organic film 321 may include, for example, a first matrix 321a and a first ultraviolet light absorbent 321b, e.g., an ultraviolet absorbing material or compound, dispersed in the first matrix 321a.

The first ultraviolet light absorbent 321b may include a material, for example, an organic compound, that absorbs ultraviolet light, for example, light having a wavelength from about 200 nm to about 400 nm. Examples of such a material may include one or more of a benzophenone compound, a benzotriazole compound, a benzoate compound, a cyanoacrylate compound, a triazine compound, an oxanilide compound, and a salicylate compound. The compound may include one or more hydroxyl groups. One of the above-stated materials may be included in the first organic film 321, or two or more of the above-stated materials may be included in the first organic film 321.

Examples of the benzophenone compound may include, for example, 2,4-dihydroxybenzophenone, 2-hydroxy-4-m ethoxybenzophenone, 2-2-dihydroxybenzophenone, 2,2',4', 4'-tetrahydroxybenzophenone, 2-hydroxy-4-octylbenzophenone, 4-dodecyloxy-2'-hydroxy-4,4'-dimethoxybenzophenone, and the like.

Examples of the benzotriazole compound may include 2-(5-methyl-2-hydroxyphenyl)benzotriazole, 2-(2-hydroxy-3,5-bis(α, α-dimetylbenzyl)phenyl]-2H-benzotriazole, 2-(3, 5-di-t-butyl-2-hydroxyphenyl)benzotriazole, 2-(3-t-butyl-5-methyl-2-hydroxyphenyl)-5-chlorobenzotriazole, 2-(3,5-di-t-butyl-2-hydroxyphenyl)-5-chlorobenzotriazole, 2-(3,5-di-t-acyl-2-hydroxyphenyl)benzotriazole, 2-(2'-hydroxy-5'-t-octylphenyl)benzotriazole, and the like.

Examples of the benzoate compound may include 2,4-di-t-butylphenyl-3',5'-di-t-butyl-4-hydroxybenzoate and the like.

Examples of the triazine compound may include 2-[4-[(2-hydroxy-3-dodecyloxypropyl)oxy]-2-hydroxyphenyl]-4,6-bis(2,4-dimethylphenyl)-1,3,5-triazine, and the like.

Examples of the salicylate compound may include phenyl salicylate, 4-t-butylphenylsalicylate, etc.

Chemical formulas of the benzophenone compound and the benzotriazole compound from among the above-stated ultraviolet light absorbent materials are shown below.

<Formula 1>

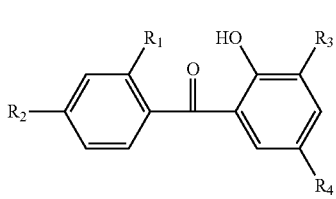

In Formula 1 above, $R_1$ may be hydrogen (H), an alkyl group, or a hydroxyl group, $R_2$ may be H, an alkyl group, or a phenyl group, $R_3$ may be H or an alkyl group, and $R_4$ may be H or an alkoxy group.

<Formula 2>

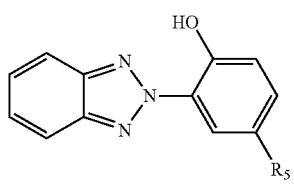

In Formula 2 above, $R_5$ may be hydrogen (H) or an alkyl group.

In Formulas 1 and 2, each of the benzophenone compound and the benzotriazole compound has a hydroxyl group (—OH). The first ultraviolet light absorbent 321b may be or include, for example, a monomer material having a hydroxyl group (—OH), which may provide hydrogen bonding. Ultraviolet light from outside may be absorbed, for example, due to an excited-state intramolecular proton transfer (ESIPT) phenomenon. For example, the first ultraviolet light absorbent 321b may be a compound having atoms adjacent to a hydroxyl group (—OH) and having non-covalent electron pairs, such as oxygen (O) atoms or nitrogen (N) atoms, where hydrogen bonding may be generated between a hydroxyl group —OH and the atoms having non-covalent electron pairs. The ultraviolet light absorbent 321b excited by absorbing ultraviolet light may undergo phototautomerization, in which protons move in excited molecules, and thus H atoms may be released from the hydroxyl group —OH to form a stable keto-form molecules. As a result, heat may be released. Therefore, ultraviolet light incident to the first ultraviolet light absorbent 321b may be converted into heat energy and radiated to the outside, which may reduce or prevent ultraviolet light from being transmitted into the display. Furthermore, the first matrix 321a of the first organic film 321 may be prevented from being excessively irradiated with ultraviolet light, so that damage of organic matter included in the first matrix 321a may be minimized.

An amount of the first ultraviolet light absorbent 321b in the first matrix 321a may vary, for example, depending on the thickness of the first organic film 321 and the absorption wavelength range of first ultraviolet light absorbent 321b. For example, the first ultraviolet light absorbent 321b may be included in an amount of about 0.1 wt % to about 20 wt %.

The first matrix 321a may be a layer including an organic material based on which the film characteristics of the first organic film 321 are set, and may include, for example, one or more of an acrylic resin, a methacrylic resin, an isoprene resin, a vinyl resin, an epoxy resin, a urethane resin, a cellulose resin, a perylene resin, and an imide resin. The first organic film 321, which may be formed using the first matrix 321a as a main constituent, may be arranged to have an appropriate thickness in consideration of productivity, device characteristics, and thickness of an inorganic film. The first organic film 321 may reduce stress of the first inorganic film 311 and/or the second inorganic film 312, and may planarize the first inorganic film 311 and/or the second inorganic film 312.

Various methods may be used to form the first organic film 321. For example, an organic film forming layer, including, for example, a mixture of a first monomer including an organic material for forming the first matrix 321a and a second monomer including the first ultraviolet light absorbent 321b, may be accommodated on the first inorganic film 311 by using a methods, such as evaporation, inkjet printing, screen printing, and spin coating. A particular method of forming an organic film of the encapsulator 300 will be described below with reference to FIG. 8.

The structure, the materials, the functions, and the manufacturing method of the first organic film 321 as described above may be identical to those of the second organic film 322.

The second inorganic film 312 may be arranged on the first organic film 321. The second inorganic film 312, like the first inorganic film 311, may include a single film or stacked films including a metal oxide or a metal nitride. The second inorganic film 312 may include a material different from that of the first inorganic film 311. The second inorganic film 311 may include a suitable material by taking a material of a lower layer material of the first inorganic film 311 and the thicknesses the inorganic films 311 and 312 into account.

The second organic film 322 may be arranged on the second inorganic film 312. The second organic film 322 may include a second matrix 322a and a second ultraviolet light absorbent 322b dispersed in the second matrix 322a. Like the first ultraviolet light absorbent 321b, the second ultraviolet light absorbent 322b may include an organic compound such as, for example, one or more of a benzophenone compound, a benzotriazole compound, a benzoate compound, a cyanoacrylate compound, a triazine compound, an oxanilide compound, and a salicylate compound, and may include one or more hydroxyl groups. The first and second ultraviolet light absorbents 321b, 322b may be organic compounds. The second ultraviolet light absorbent 322b may be a different compound from the first ultraviolet light absorbent 321b. The materials or compounds of the first and second ultraviolet light absorbents may have different ultraviolet light absorption wavelength ranges, respectively.

In an embodiment, by arranging the plurality of second ultraviolet light absorbents 322b and the plurality of first ultraviolet light absorbents 321b using different materials, ultraviolet light of a wavelength range not absorbed by the second organic film 322 may be absorbed by the first organic film 321. For example, by using a material capable of absorbing ultraviolet light of longer wavelengths for the first organic film 321, which may be a lower layer, as compared to the second organic film 322, which may be an upper layer, ultraviolet light of a relatively wide wavelength range may be blocked.

The third inorganic film 313 may be arranged on the second organic film 322. According to the present example embodiment, the third inorganic film 313 is located on the uppermost layer of the encapsulator 300. By arranging the uppermost layer of the encapsulator 300 exposed to outside as an inorganic film, infiltration of oxygen and moisture into a display may be reduced or prevented.

Figure 4:
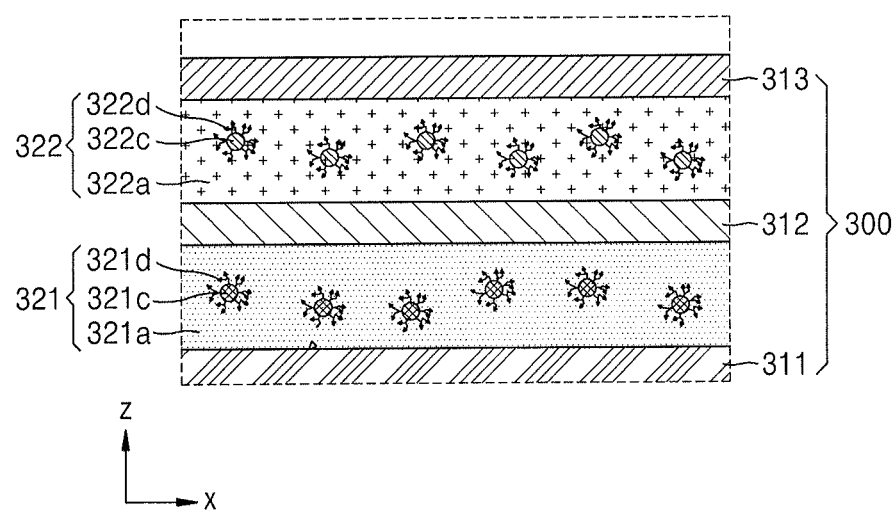
FIG. 4 illustrates a cross-sectional diagram schematically showing a display apparatus according to another embodiment.

FIG. 4 is a cross-sectional diagram schematically showing a display apparatus according to another example embodiment.

In the example embodiment shown in FIG. 4, an ultraviolet light absorbent included in an organic film is cross-linked with a matrix constituting the organic film. The present example embodiment will be described in detail by focusing on differences from the previous example embodiments.

The first inorganic film 311, containing, for example, a metal oxide or a metal nitride, may arranged on the lowermost layer of the encapsulator 300, and the first organic film 321 may be arranged on the first inorganic film 311. The first organic film 321 may include an organic material, for example, the first matrix 321a and the first ultraviolet light absorbent 321c dispersed in the first matrix 321a.

The first ultraviolet light absorbent 321c may be, for example, an organic compound and may include one or more of a benzophenone compound, a benzotriazole compound, a benzoate compound, a cyanoacrylate compound, a triazine compound, an oxanilide compound, and a salicylate compound.

The first ultraviolet light absorbent 321c may include, for example, one or more of an acrylate group, a methacrylate group, and an epoxy group, and may have a structure in which the material or compound is coupled with at least one functional group 321d from among an acrylate group, a methacrylate group, and an epoxy group. The functional group 321d may be cross-linked to the first matrix 321a, which may provide a more dense film characteristic to the first organic film 321.

The first matrix 321a may be, for example, a layer including an organic material based on which the basic film characteristics of the first organic film 321 is set, and may include, for example, one or more of an acrylic resin, a methacrylic resin, an isoprene resin, a vinyl resin, an epoxy resin, a urethane resin, a cellulose resin, a perylene resin, and an imide resin.

In the first matrix 321a, the first ultraviolet light absorbent 321c may be dispersed. According to the present example embodiment, the first ultraviolet light absorbent 321c and the first matrix 321a are cross-linked with each other, for example, by the above-stated functional group 321d. By coupling the first ultraviolet light absorbent 321c with the first matrix 321a, the first ultraviolet light absorbent 321c may not be easily separated from the first organic film 321.

The first organic film 321 may be formed by providing an organic film forming layer, which may include a first monomer including an organic material for forming the first matrix 321a and a second monomer including the plurality of first ultraviolet light absorbents 321c, on the first inorganic film 311. In the operation of forming the organic film forming layer, the first monomer and the second monomer may be cross-linked by the functional group 321d included in the first ultraviolet light absorbent 321c.

The second inorganic film 312 may be arranged on the first organic film 321, and the second organic film 322 may be arranged on the second inorganic film 312. The second organic film 322 may include an ultraviolet light absorbent different from that of the first organic film 321. Therefore, the second organic film 322 and the first organic film 321 may absorb ultraviolet light of different wavelengths, and thus the wavelength range of ultraviolet light blocked by the encapsulator 300 may be increased.

The third inorganic film 313 may be arranged on the second organic film 322, and may be the uppermost layer of the encapsulator 300 exposed to outside as an inorganic film. Thus, infiltration of moisture and oxygen into a display may be reduced or prevented.

Figure 5A:
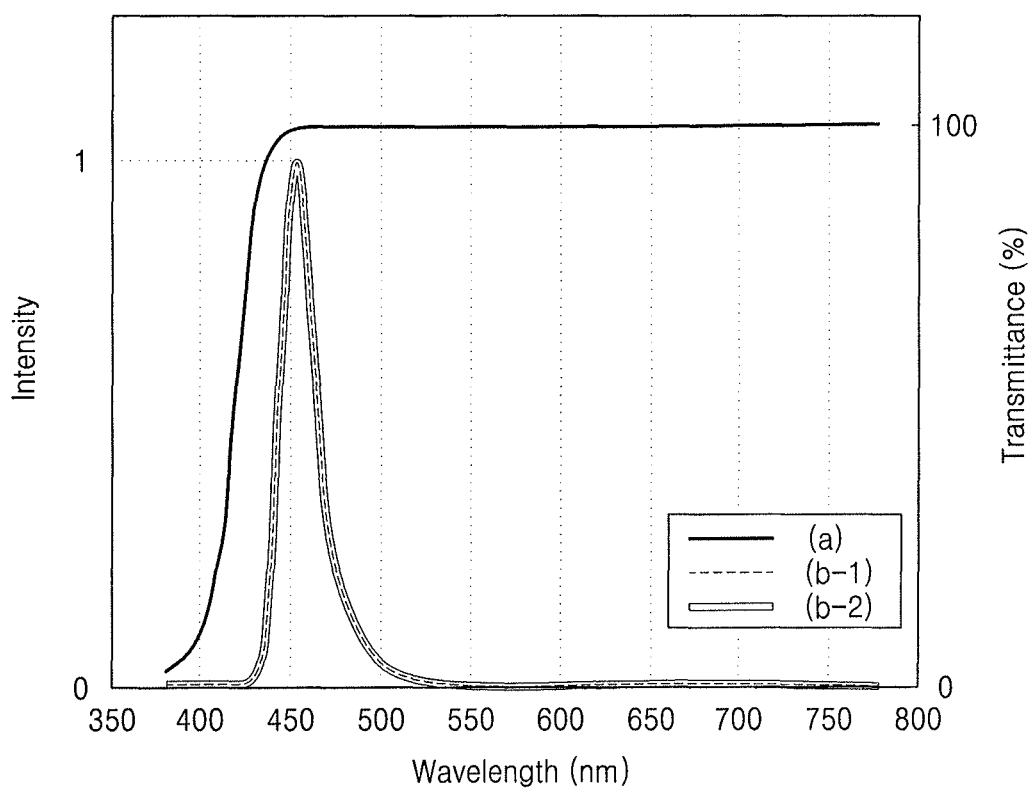
FIG. 5A illustrates a graph showing both changes in transmittance according to wavelengths of incident light and changes in intensity according to wavelengths of emitted light in a display device according to an embodiment.
Figure 5B:
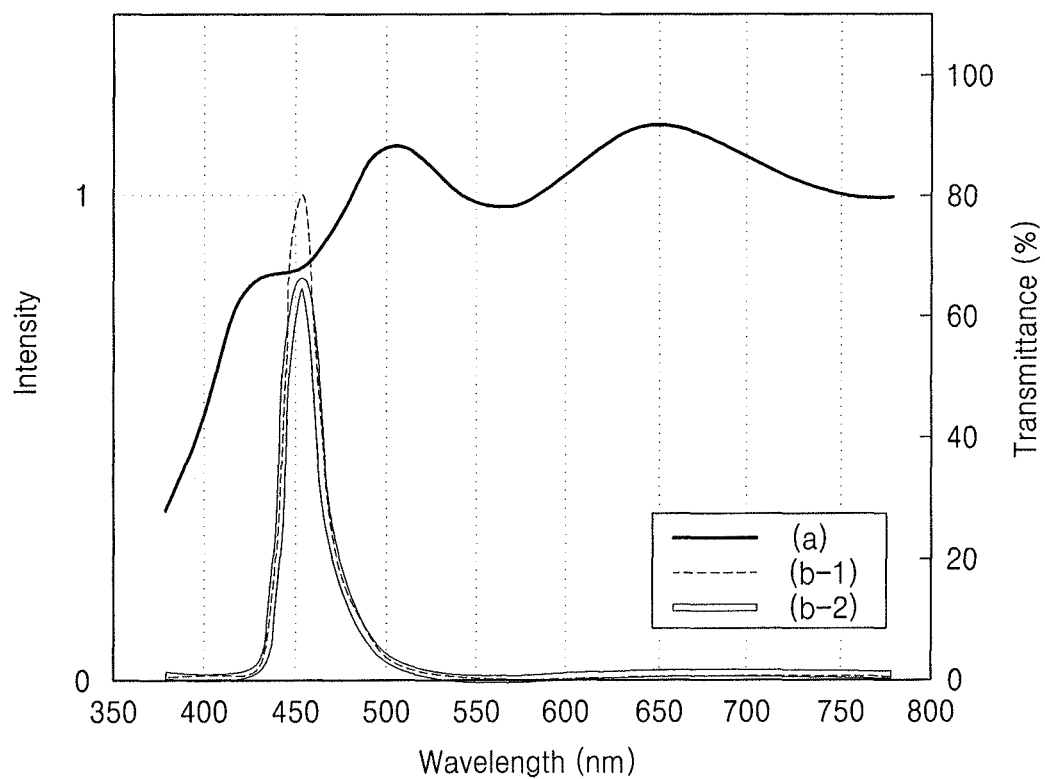
FIG. 5B illustrates a graph showing both changes in transmittance according to wavelengths of incident light and changes in intensity according to wavelengths of emitted light in a display device according to a comparative example.

FIG. 5A is a graph showing both changes in transmittance according to wavelengths of incident light and changes in intensity according to wavelengths of emitted light in a display device according to an embodiment. FIG. 5B is a graph showing both changes in transmittance according to wavelengths of incident light and changes in intensity according to wavelengths of emitted light in a display device according to a comparative example.

Referring to FIGS. 5A and 5B, the horizontal axis of the graph represents the wavelength of light, the vertical axis located on the left side of the graph represents the intensity of light, and the vertical axis located on the right side of the graph represents the transmittance of light. The graphs shown in FIGS. 5A and 5B show results obtained by measuring transmittances and intensities by using a display device without a polarizing plate.

The curve (a) of FIG. 5A indicates changes in transmittance according to wavelengths of light incident to a display device according to an embodiment. As indicated by the curve (a), the display device according to an embodiment may exhibit a transmittance of 80% or higher with respect to external light having a wavelength of 430 nm or longer. The transmittance with respect to external light may be adjusted to various values according to types, combinations, and concentrations of an ultraviolet light absorbent, the thickness of an organic film in which the ultraviolet light absorbent is dispersed, etc.

The curve (b-1) of FIG. 5A indicates changes in intensity according to wavelengths of blue light emitted from a general display device, and the curve (b-2) of FIG. 5A indicates changes in intensity according to wavelengths of blue light emitted from a display device according to an embodiment.

For example, when a display device emits blue light, green light, and red light, the blue light having a wavelength band closest to the ultraviolet light wavelength band is significantly affected by a degree to which the display device absorbs light in the ultraviolet wavelength. Thus, while a display device absorbs ultraviolet light, transmittance with respect to light between the visible light wavelength band and the ultraviolet light wavelength band may be lowered, and thus light emission efficiency regarding blue light emitted from the display device may also be lowered.

In this regard, referring to the curves (b-1) and (b-2) of FIG. 5A, when transmittance with respect to light of the wavelength of 430 nm (which is the shortest wavelength in the blue light wavelength band) or longer wavelengths in the blue light wavelength band is 80% or higher, there is hardly a difference between the intensity of blue light of a general display device and the intensity of blue light of a display device according to an embodiment (which is capable of absorbing an ultraviolet light). Specifically, when transmittance with respect to external light having a wavelength of 430 nm or longer is about 80%, the relative decrease in blue light emission efficiency may be less than or equal to about 2%.

A comparative example showing the above-stated effect is shown in FIG. 5B. FIG. 5B is a graph showing changes in transmittance according to wavelengths of light incident to a display device according to the comparative example. The display device according to the comparative example exhibits transmittance less than 80% with respect to external light having a wavelength of 430 nm or longer.

The curve (b-1) of FIG. 5B indicates changes in intensity with respect to wavelengths of blue light emitted from a common display device, whereas the curve (b-2) of FIG. 5B indicates changes in intensity according to wavelengths of blue light emitted from the display device according to the comparative example.

Referring to the curves (b-1) and (b-2) of FIG. 5B, when transmittance with respect to light of the wavelength of 430 nm, which is approximately the shortest wavelength in the blue light wavelength band, or longer wavelengths in the blue light wavelength band is less than 80%, the intensity of blue light of the display device according to an embodiment (capable of absorbing an ultraviolet light) is significantly reduced as compared to the intensity of blue light of the common display device. Specifically, when transmittance with respect to external light having a wavelength of 430 nm or longer is about 70%, the decrease in blue light emission efficiency may be about 10%.

Therefore, in the case of the display device according to an embodiment, it is necessary to appropriately adjust the type, the combination, and the concentration of an ultraviolet light absorbent and the thickness of an organic film in which the ultraviolet light absorbent is dispersed, such that transmittance with respect to external light having a wavelength of 430 nm or longer is 80% or higher.

Figure 6:
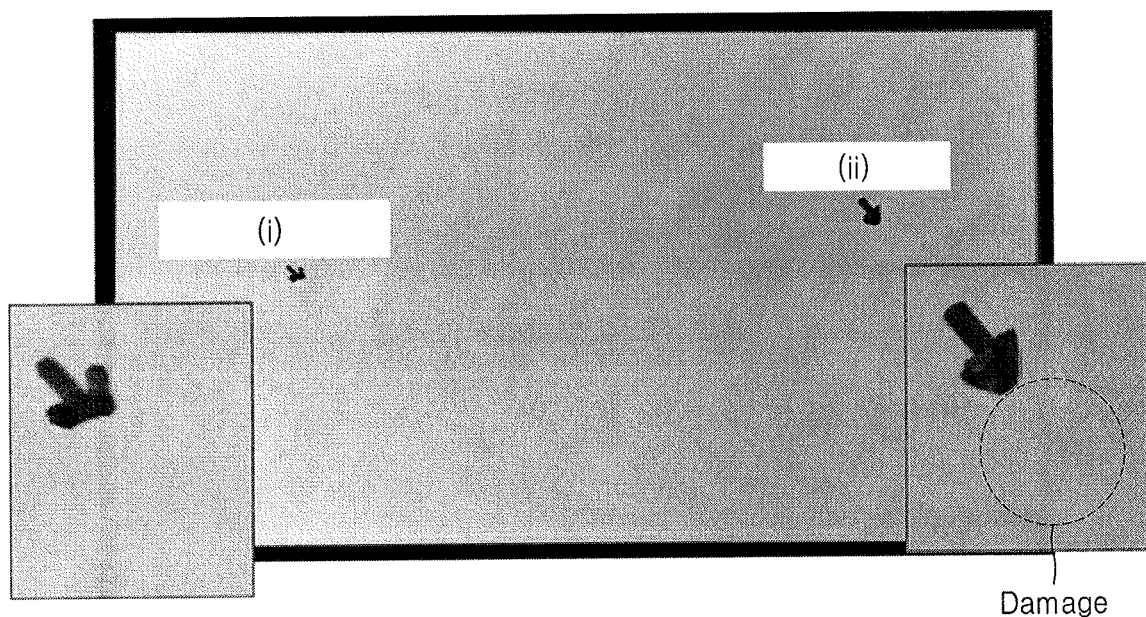
FIG. 6 illustrates an image showing the degrees of damages of a display device according to an embodiment and a display device according to a comparative example.

FIG. 6 illustrates an image showing the degrees of damage of a display device according to an embodiment and a display device according to a comparative example.

In a display panel of FIG. 6, the area indicated by the arrow (i) is an area where external light having a wavelength of 405 nm is incident to a portion of the display device according to an embodiment, and the area indicated by the arrow (ii) is an area where external light having a wavelength of 405 nm is incident to a portion of the display device according to the comparative example. FIG. 6 shows results of measurements obtained by using a display device without a polarizing plate.

Specifically, the display device according to an embodiment disposed in the area indicated by the arrow (i) may exhibit transmittance less than 10% with respect to external light having a wavelength of 405 nm or shorter. In contrast, the display device according to the comparative example disposed in the area indicated by the arrow (ii) may exhibit transmittance higher than 10% with respect to external light having a wavelength of 405 nm or shorter.

Referring to the left magnified portion of FIG. 6, when transmittance with respect to light having a wavelength of 405 nm (which is approximately the longest wavelength in the ultraviolet light wavelength band) or shorter wavelengths in the ultraviolet light wavelength band is 10% or less (as in the area indicated by the arrow (i)), no particular abnormality may be observed in the area even when exposed to light having a wavelength of 405 nm or shorter.

In contrast, referring to right magnified portion of FIG. 6, when transmittance with respect to light having a wavelength of 405 nm or shorter wavelengths in the ultraviolet light wavelength band (such as the area indicated by the arrow (ii)) exceeds 10%, it may be confirmed that the original color of the area is changed when exposed to light having a wavelength of 405 nm or shorter. The reason thereof is a defect, such as brightness reduction, due to damage to an emission layer, for example.

Therefore, in the case of the display device according to an embodiment, the type, the combination, and/or the concentration of an ultraviolet light absorbent, and the thickness of an organic film in which the ultraviolet light absorbent is dispersed are selected such that transmittance with respect to external light having a wavelength of 405 nm or shorter is less than or equal to 10%.

Figure 7:
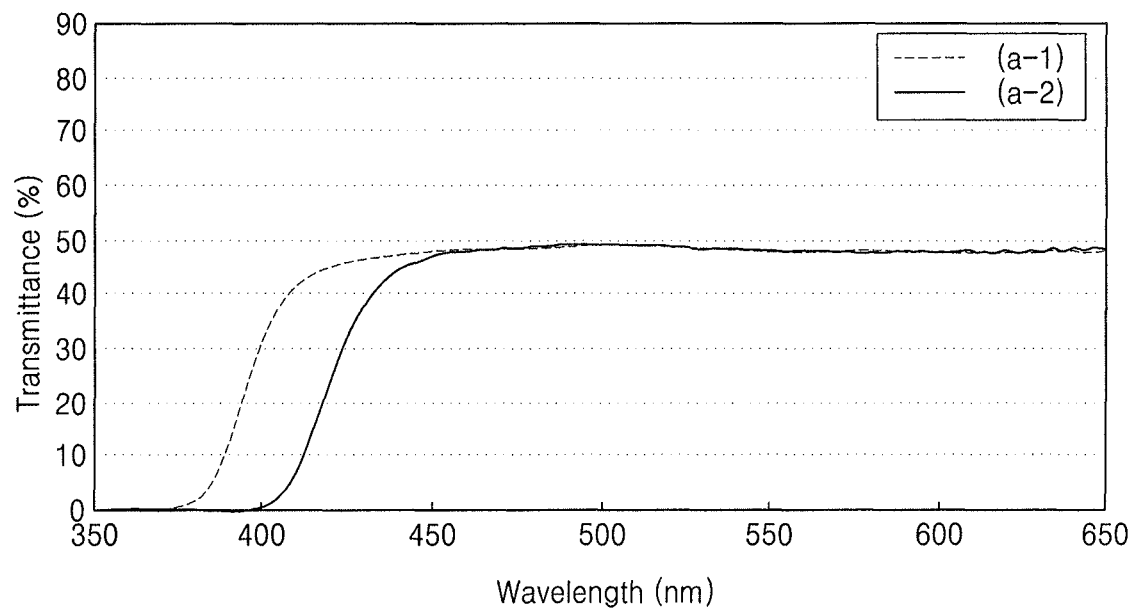
FIG. 7 illustrates a graph showing changes in transmittance according to wavelengths of light incident to a display device according to an embodiment.

FIG. 7 is a graph showing changes in transmittance according to wavelengths of light incident to a display device according to an embodiment and a comparative example.

In FIG. 7, the horizontal axis of the graph represents the wavelength of light, whereas the vertical axis of the graph represents the transmittance of light.

The curve (a-1) of FIG. 7 indicates changes in transmittance according to wavelengths of light incident to a display device according to a comparative example. The display device according to the comparative example is a display device including only a polarizing plate without an ultraviolet light absorbent.

In contrast, the curve (a-2) of FIG. 7 indicates changes in transmittance according to wavelengths of light incident to the display device according to an embodiment. The display device according to an embodiment may be, as described above, a display device including both an encapsulator, in which an ultraviolet light absorbent is dispersed, and a polarizing plate.

Referring to FIG. 7, although about 50% or more of external light may be blocked by a polarizing plate in the comparative example indicated by the curve (a-1), transmittance with respect to light having a wavelength of 405 nm (which is approximately the longest wavelength in the ultraviolet light wavelength band) or shorter wavelengths in the ultraviolet light wavelength band exceeds 30%. Thus, transmittance with respect to external light having a wavelength between the visible light wavelength band and the ultraviolet light wavelength band is relatively high, and thus there may be a limit in preventing damages to an emission layer and an organic insulating film.

In contrast, in the case of the embodiment indicated by the curve (a-2), about 50% or more of external light may be blocked by a polarizing plate. Furthermore, transmittance with respect to light having a wavelength of 405 nm or shorter wavelengths in the ultraviolet light wavelength band is reduced to below 10%. Therefore, damage to an emission layer and an organic insulating film may be more effectively prevented.

Figure 8:
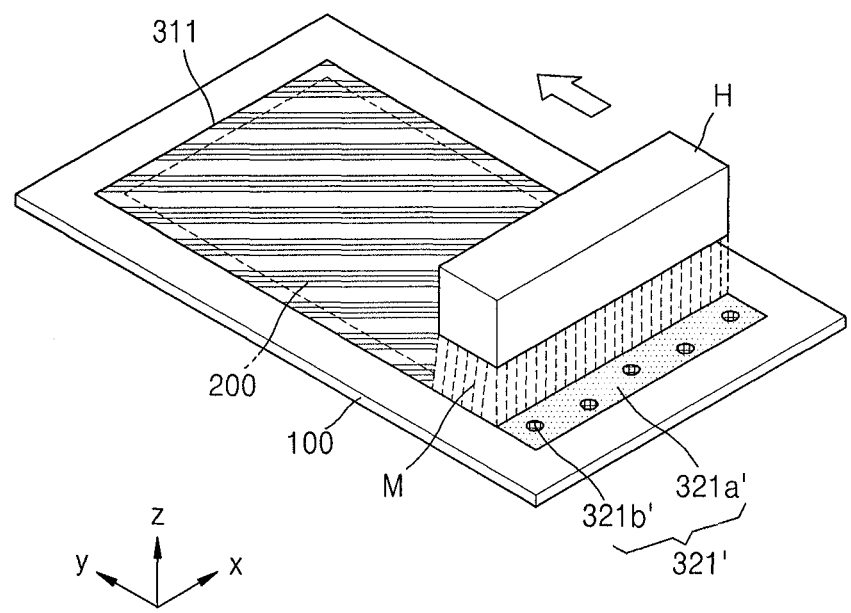
FIG. 8 illustrates a diagram schematically showing a method of manufacturing a display apparatus, according to an embodiment.

FIG. 8 is a diagram schematically showing a method of manufacturing a display apparatus according to an embodiment.

As shown in FIG. 8, an organic film forming layer 321' may be formed by using an inkjet printing method. The organic film forming layer 321' may be formed as a mixture (for example, a mixture of a first monomer 321a' including an organic material for forming a matrix and a second monomer 321b' including an ultraviolet light absorbent) on the first inorganic film 311, which is a lower layer. As a print head H scans the upper portion of the substrate 100 in the +y direction while continuously spraying the mixture of the first monomer 321a' and the second monomer 321b', the organic film forming layer 321' including the ultraviolet light absorbent is formed on the substrate 100. In order to effectively spray the mixture of the monomers 321a' and 321b', a plurality of nozzles may be provided inside the print head H.

As described above, as the organic film forming layer 321' may be formed using an ink-jet printing method. Thus, expansion of the organic film forming layer 321' out of a region corresponding to the first inorganic film 311, which is a target region on the display 200, may be prevented. The organic film forming layer 321' may be applied onto the substrate 100 in a substantially liquid state. Thus, changes (for example, in the molecular weight and/or the chain structure) of the ultraviolet light absorbent due to the heat of vaporization in an evaporation method may be prevented. However, the method of forming the organic film forming layer 321' is not necessarily limited to the ink-jet printing method, and a screen printing method, a spin coating method, etc., may also be used.

The organic film forming layer 321' may be cured by irradiating an ultraviolet ray onto the top of the organic film forming layer 321'. In this case, the first monomer 321a' for forming a matrix may be changed to an organic copolymer and may be fixed onto the substrate 100. Therefore, an organic encapsulating film having a structure in which a plurality of ultraviolet light absorbents are simply mixed or cross-linked with one another in the organic copolymer may be formed.

By way of summation and review, among display apparatuses, an organic light emitting display device is attracting attention as a display device having excellent characteristics, such as a slim profile, light weight, and low power consumption. As outdoor use of information devices increases, a time during which a display device is exposed to sunlight may increase. Furthermore, an operation that includes irradiating ultraviolet rays may be used in a process of manufacturing a display device. If ultraviolet rays from outside are freely transmitted to the interior of a display device, an emission layer and an insulating film including organic materials may be damaged.

As described above, embodiments relate to a display apparatus that may reduce ultraviolet light transmission into the display apparatus, and a method of manufacturing the same. Embodiments may provide a display apparatus and a method for manufacturing the same in which damage to an emission layer and an insulation film including organic materials due to an ultraviolet light may be reduced or prevented. Furthermore, a separate ultraviolet shielding film may be omitted. Thus, thickness of a display apparatus may be reduced, which may improve flexibility of the display apparatus. Furthermore, quality of a display apparatus may be improved by limiting an amount of ultraviolet rays irradiated in a process of manufacturing the display apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a substrate;
a display part arranged on the substrate and including a plurality of display elements; and
an encapsulator covering the display part and extending continuously across the plurality of display elements,
wherein the encapsulator, comprising:
a first inorganic film disposed on the plurality of display elements;
a first organic film disposed on the first organic film and including a first ultraviolet light absorbent;
a second inorganic film disposed on the first organic film;
a second organic film disposed on the second inorganic film, and including a second ultraviolet light absorbent; and
a third inorganic film disposed on the second organic film;
wherein a wavelength range of light absorbed by the first ultraviolet light absorbent being different from a wavelength range of light absorbed by the second ultraviolet light absorbent, and
wherein the first ultraviolet light absorbent and the second ultraviolet light absorbent are each independently a compound that includes a hydroxyl group.

2. The display apparatus as claimed in claim 1, wherein the first ultraviolet light absorbent includes one or more selected from a benzophenone compound, a benzotriazole compound, a benzoate compound, a cyanoacrylate compound, a triazine compound, an oxanilide compound, and a salicylate compound.

3. The display apparatus as claimed in claim 1, wherein the first organic film comprises a functional group including at least one selected from an acrylate group, a methacrylate group, and an epoxy group.

4. The display apparatus as claimed in claim 1, wherein the plurality of display elements are configured to emit light at least in a direction toward the encapsulator.

5. The display apparatus as claimed in claim 1, wherein the display apparatus exhibits a transmittance of 80% or higher with respect to light having a wavelength of 430 nm, and
wherein the display apparatus exhibits a transmittance of less than or equal to 10% with respect to light having a wavelength of 405 nm.

* * * * *